US012729323B2

(12) United States Patent
Yokoyama et al.

(10) Patent No.: US 12,729,323 B2
(45) Date of Patent: Sep. 8, 2026

(54) ADHESIVE SHEET, DISPLAY DEVICE USING THE SAME, COMPOSITION FOR FORMING ADHESIVE LAYER USED FOR PRODUCTION OF ADHESIVE FILM

(71) Applicants: TOPPAN INC., Tokyo (JP); TOPPAN TOMOEGAWA OPTICAL FILMS CO., LTD., Tokyo (JP)

(72) Inventors: Yuri Yokoyama, Tokyo (JP); Yoshiko Ishimaru, Tokyo (JP); Koichi Minato, Tokyo (JP); Rui Inoue, Tokyo (JP); Keisuke Ogata, Tokyo (JP)

(73) Assignees: TOPPAN INC., Tokyo (JP); TOPPAN TOMOEGAWA OPTICAL FILMS CO., LTD., Tokyo (JP)

( * ) Notice: Subject to any disclaimer, the term of this patent is extended or adjusted under 35 U.S.C. 154(b) by 346 days.

(21) Appl. No.: 18/222,081

(22) Filed: Jul. 14, 2023

(65) Prior Publication Data

US 2023/0357603 A1 Nov. 9, 2023

Related U.S. Application Data

(63) Continuation of application No. PCT/JP2021/034753, filed on Sep. 22, 2021.

(30) Foreign Application Priority Data

Jan. 19, 2021 (JP) ................................ 2021-006392

(51) Int. Cl.

| | |
|---|---|
| ***B32B 7/12*** | (2006.01) |
| ***B32B 7/023*** | (2019.01) |
| ***C08K 5/00*** | (2006.01) |
| ***C09J 7/30*** | (2018.01) |
| ***C09J 11/06*** | (2006.01) |
| ***C09J 133/06*** | (2006.01) |
| ***G02B 1/111*** | (2015.01) |
| ***G02B 1/16*** | (2015.01) |

(Continued)

(52) U.S. Cl.

CPC ................ *C09J 7/30* (2018.01); *B32B 7/023* (2019.01); *B32B 7/12* (2013.01); *C08K 5/0041* (2013.01); *C09J 11/06* (2013.01); *C09J 133/066* (2013.01); *G02B 1/111* (2013.01); *G02B 5/208* (2013.01); *G02B 5/283* (2013.01); *B32B 27/308* (2013.01); *B32B 2307/4026* (2013.01); *B32B 2307/412* (2013.01); *B32B 2307/71* (2013.01); *B32B 2457/20* (2013.01); *B32B 2457/206* (2013.01); *C08K 5/005* (2013.01); *C09J 2203/318* (2013.01); *C09J 2301/208* (2020.08); *C09J 2301/312* (2020.08); *C09J 2301/408* (2020.08); *G02B 1/16* (2015.01); *H10K 59/8792* (2023.02)

(58) Field of Classification Search

CPC . C09J 7/30; C09J 11/06; C09J 133/066; C09J 2203/318; C09J 2301/208; C09J 2301/312; C09J 2301/408; C09J 2301/41; C09J 7/10; C09J 9/00; C09J 11/00; C09J 201/00; B32B 7/023; B32B 7/12; B32B 27/308; B32B 2307/4026; B32B 2307/412; B32B 2307/71; B32B 2457/20; B32B 2457/206; C08K 5/0041; C08K 5/005; C08K 2201/014; C08K 2201/019; C08K 5/0091; C08K 5/3472; C08K 5/3492; C08K 5/34926; H10K 59/8792; H10K 59/38; G02B 5/208; G02B 5/283; G02B 1/16; G02B 1/18; G02B 1/111; G02B 1/115; G02B 5/22; G09F 3/0294; H05B 33/02; H05B 33/12

See application file for complete search history.

(56) References Cited

U.S. PATENT DOCUMENTS

2014/0017467 A1* 1/2014 Inao ........................ B32B 7/12 428/354
2015/0092264 A1* 4/2015 Youn ....................... G02B 5/22 252/589

(Continued)

FOREIGN PATENT DOCUMENTS

JP 2007-094090 A 4/2007
JP 2012-155243 A 8/2012

(Continued)

OTHER PUBLICATIONS

International Search Report mailed Nov. 22, 2021 for International Application No. PCT/JP2021/034753, with English translation, 5 pages.

*Primary Examiner* — John D Freeman
(74) *Attorney, Agent, or Firm* — Squire Patton Boggs (US) LLP

(57) ABSTRACT

Provided are an adhesive sheet that can reduce reflectance, increase luminance and reduce thickness of a display device, a display device using the adhesive sheet, and a composition for forming adhesive layer used for producing the adhesive sheet. An adhesive sheet comprising a first adhesive layer containing an adhesive and a dye, and an ultraviolet absorbing layer laminated on one surface side of the first adhesive layer, wherein the dye contains a first coloring material having a maximum absorption wavelength in the range of 470 to 530 nm and a half width of the absorption spectrum of 15 to 45 nm, and a second coloring material having a maximum absorption wavelength in the range of 560 to 620 nm and a half width of the absorption spectrum of 15 to 55 nm, and the ultraviolet absorbing layer has an ultraviolet shielding rate of 85% or more according to JIS L 1925.

12 Claims, 3 Drawing Sheets

(51) Int. Cl.

| | |
|---|---|
| ***G02B 5/20*** | (2006.01) |
| ***G02B 5/28*** | (2006.01) |
| *B32B 27/30* | (2006.01) |
| *H10K 59/80* | (2023.01) |

(56) References Cited

U.S. PATENT DOCUMENTS

| | | | |
|---|---|---|---|
| 2016/0216604 | A1 | 7/2016 | Fujita et al. |
| 2020/0217999 | A1 | 7/2020 | Miyata et al. |

FOREIGN PATENT DOCUMENTS

| | | | |
|---|---|---|---|
| JP | 2013-251376 | A | 12/2013 |
| JP | 2018-193538 | A | 12/2018 |
| JP | 2019-056865 | A | 4/2019 |
| WO | WO 2015/046285 | A1 | 4/2015 |
| WO | WO 2019/065021 | A1 | 4/2019 |

* cited by examiner 11
22
21

12
20
21

13
20
22
21

14
23
20
30

ADHESIVE SHEET, DISPLAY DEVICE USING THE SAME, COMPOSITION FOR FORMING ADHESIVE LAYER USED FOR PRODUCTION OF ADHESIVE FILM

CROSS REFERENCE TO RELATED APPLICATION

This application is a bypass continuation application of International Application No. PCT/JP2021/034753 filed on Sep. 22, 2021, claiming the priority based on Japanese Patent Application No. 2021-006392 filed on Jan. 19, 2021. The disclosures in these applications are incorporated in the present specification by reference.

BACKGROUND

Field

The present invention relates to an adhesive sheet used for display devices and the like, a display device using the same, and a composition for forming adhesive layer used for production of adhesive films.

Description of the Related Art

A display device is often used in an environment where external light is incident regardless of whether it is indoors or outdoors. External light incident on the display device is reflected on the surface of the display device, and the reflected image of the external light is mixed with the displayed image, thereby causing deterioration in display quality. Therefore, it is essential to provide the display device with an antireflection function, and in order to improve the display quality, a high performance of the antireflection function is required.

In general, the antireflection function can be imparted by forming a low refractive index layer on the surface of a display device. In addition, in order to increase the performance of the antireflection function, there is also known a method of providing a high refractive index layer or both a medium refractive index layer and a high refractive index layer, and forming a low refractive index layer on the outermost surface.

In addition, there is also a problem that external light incident on a display device is reflected by members inside the display device (e.g., electrodes, phosphors, color filters), and the reflected light is re-emitted from the display surface, resulting in a decrease in display quality. As a solution to this problem, a technique is known in which a circularly polarizing plate is provided on the display surface side to reduce external light incident to the inside of the display device and reflection inside the display device (see, e.g., Japanese Laid-Open Publication No. 2013-251376).

Further, in general, display devices are required to have high color purity. The color purity indicates the range of colors that can be displayed by a display device, and is also called color reproduction range. Therefore, high color purity means a wide color reproduction range and good color reproducibility. For improving the color reproducibility, a method of separating colors using a color filter for a white light source of a display panel or correcting a monochromatic light source with a color filter to narrow the half value is known.

SUMMARY

In a display device using a circularly polarizing plate to provide an antireflection function, the light emitted from the display panel is also absorbed by the circularly polarizing plate. Considering the absorption by a film and the like other than the circularly polarizing plate, the transmittance of the light emitted from the display panel is less than 50%, resulting in a significant decrease in luminance. In order to compensate for the decrease in luminance, it is necessary to increase the emission intensity of the display panel, but this may cause a decrease in the life of the light emitting device. Furthermore, when using a circularly polarizing plate, there is also a problem that thinning is difficult due to the thickness of the circularly polarizing plate itself.

In addition, in order to improve the color reproducibility of a display device, it is necessary to increase the thickness of a color filter and increase the density of a coloring material, which causes a problem of a decrease in display quality such as deterioration of the pixel shape and viewing angle property, and the like.

Then, the present invention has an object of providing an adhesive sheet that can reduce reflection, increase luminance, reduce thickness, and improve color reproducibility of a display device, a display device using the adhesive sheet, and a composition for forming adhesive layer used for producing the adhesive sheet.

The adhesive sheet according to the present invention comprises a first adhesive layer containing an adhesive and a dye, and an ultraviolet absorbing layer laminated on one surface side of the first adhesive layer. It is characterized in that the dye contains a first coloring material having a maximum absorption wavelength in the range of 470 to 530 nm and a half width of the absorption spectrum of 15 to 45 nm, and a second coloring material having a maximum absorption wavelength in the range of 560 to 620 nm and a half width of the absorption spectrum of 15 to 55 nm, and the ultraviolet absorbing layer has an ultraviolet shielding rate of 85% or more according to JIS L 1925.

Moreover, the display device according to the present invention is equipped with the adhesive sheet described above.

Further, the composition for forming adhesive layer according to the present invention is characterized by comprising an adhesive, a dye, and an additive, wherein the dye contains a first coloring material having a maximum absorption wavelength in the range of 470 to 530 nm and a half width of the absorption spectrum of 15 to 45 nm, and a second coloring material having a maximum absorption wavelength in the range of 560 to 620 nm and a half width of the absorption spectrum of 15 to 55 nm, and the additive includes one or more of a radical scavenger, a peroxide decomposer and a singlet oxygen quencher.

According to the present invention, it is possible to provide an adhesive sheet that can reduce reflection, increase luminance, reduce thickness, and improve color reproducibility of a display device, a display device using the same, and a composition for forming adhesive layer used for producing an adhesive film.

These and other objects, features, aspects, and effects of the present invention will be further clarified from the following detailed description in light of the accompanying drawings.

DETAILED DESCRIPTION

FIGS. 1 to 4 are cross-sectional views showing schematic structures of adhesive sheets according to first to fourth embodiments, respectively. The upper side in FIGS. 1 to 4 corresponds to the viewing side of a display device when used in the display device. In the present specification, the term "adhesive sheet" refers to one including an adhesive layer composed of a material containing an adhesive in the form of a sheet, alone or in combination with other layers, and includes a form with only an adhesive layer made of a sheet-like adhesive, a form with a release film on one or both sides of the adhesive layer, and a form of a transparent substrate-carrying film with at least a transparent substrate on one side of the adhesive layer.

Although the details will be described later, the adhesive sheets 11 to 14 shown in FIGS. 1 to 4 each include a first adhesive layer 21 containing a dye that absorbs light in a specific wavelength range. The display panel to which the adhesive sheets 11 to 14 are used is a display panel equipped with a light source, and particularly in the case of self-luminous display panels such as organic EL panels, micro LED panels and the like, metal electrodes, reflective members, and the like are provided. The first adhesive layer 21 has a function of reducing reflected light of external light by absorbing part of the external light incident on the adhesive sheets 11 to 14 and part of the external light reflected by the display panel (not shown) bonded to the first adhesive layer 21. However, the dye contained in the first adhesive layer 21 has low light resistance, and when it is photo-oxidized by ultraviolet rays contained in external light, the light absorbability is lowered. Therefore, in the present invention, deterioration (fading) of the first adhesive layer 21 due to incident ultraviolet rays is suppressed by providing an ultraviolet absorbing layer that absorbs ultraviolet rays on the observation side of the first adhesive layer 21.

Figures 1, 2, 3, 4:
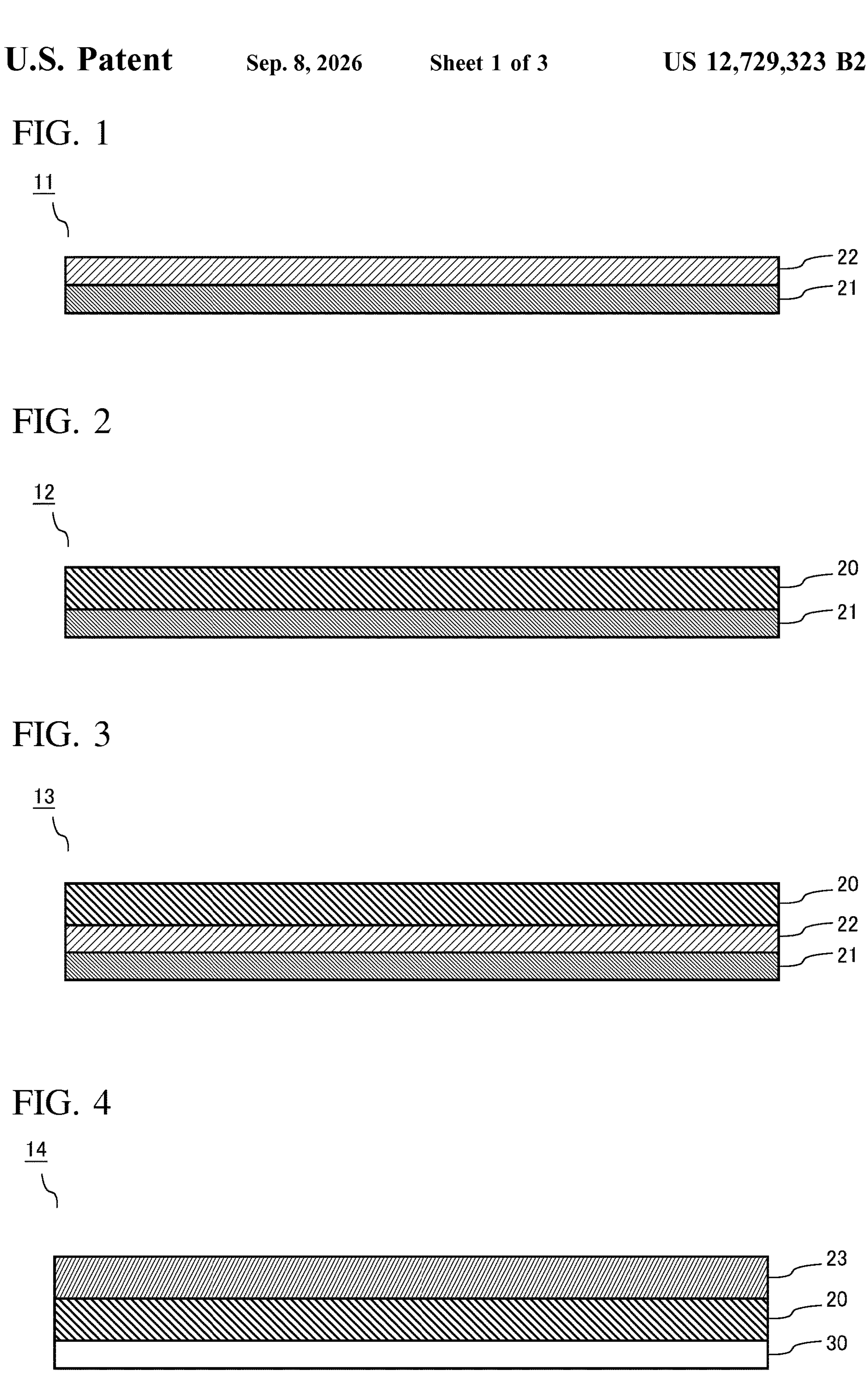
FIG. 1 is a cross-sectional view showing a schematic configuration of the adhesive sheet according to the first embodiment.
FIG. 2 is a cross-sectional view showing a schematic configuration of the adhesive sheet according to the second embodiment.
FIG. 3 is a cross-sectional view showing a schematic configuration of the adhesive sheet according to the third embodiment.
FIG. 4 is a cross-sectional view showing a schematic configuration of the adhesive sheet according to the fourth embodiment.

The adhesive sheet 11 shown in FIG. 1 has a first adhesive layer 21 and a second adhesive layer 22 laminated on one surface side of the first adhesive layer 21. The adhesive sheet 11 is used for bonding an optical film separately produced to the display panel. When the optical film is bonded using the adhesive sheet 11, the adhesive sheet 11 is used so that the first adhesive layer 21 is on the display panel side and the second adhesive layer 22 is on the optical film side. In the example of FIG. 1, the second adhesive layer 22 functions as an ultraviolet absorbing layer by containing an ultraviolet absorber. A release film (not shown) may be detachably bonded to the surfaces of the first adhesive layer 21 and the second adhesive layer 22. The release film can protect the first adhesive layer 21 and the second adhesive layer 22 until the adhesive sheet 11 is used.

The adhesive sheet 12 shown in FIG. 2 has a first adhesive layer 21 and a transparent substrate 20 bonded to one surface of the first adhesive layer 21. The adhesive sheet 12 with the transparent substrate 20 is used as an optical film to be bonded to the surface of the display panel, and typically, an optical functional layer is provided on the transparent substrate 20 to control incident light, as described later. The adhesive sheet 12 is used in a direction such that the first adhesive layer 21 is bonded to the display panel and the transparent substrate 20 is on the viewing side of the display device. In the example of FIG. 2, the transparent substrate 20 functions as an ultraviolet absorbing layer by containing an ultraviolet absorber. A release film (not shown) may be detachably bonded to the surface of the first adhesive layer 21. The release film can protect the first adhesive layer 21 until the adhesive sheet 12 is used.

The adhesive sheet 13 shown in FIG. 3 is obtained by further providing a transparent substrate 20 to the adhesive sheet 11 shown in FIG. 1. That is, the adhesive sheet 13 has a first adhesive layer 21, a second adhesive layer 22 laminated on one surface side of the first adhesive layer 21, and a transparent substrate 20 laminated to the second adhesive layer 22. The adhesive sheet 13 with the transparent substrate 20 is used as an optical film to be bonded to the surface of the display panel, and typically, an optical functional layer is provided on the transparent substrate 20 to control incident light, as described later. The adhesive sheet 13 is used in a direction such that the first adhesive layer 21 is bonded to the display panel and the transparent substrate 20 faces the viewing side of the display device. In the example of FIG. 3, the second adhesive layer 22 functions as an ultraviolet absorbing layer by containing an ultraviolet absorber. However, in addition to the second adhesive layer 22, the transparent substrate 20 may also be an ultraviolet absorbing layer containing an ultraviolet absorber. A release film (not shown) may be detachably bonded to the surface of the first adhesive layer 21. The release film can protect the first adhesive layer 21 until the adhesive sheet 12 is used.

The adhesive sheet 14 shown in FIG. 4 has an adhesive layer 30 laminated on one side of the transparent substrate 20 and an oxygen barrier layer 23 laminated on the other side of the transparent substrate 20. The adhesive layer 30 is the first adhesive layer 21 described above, or a laminate of the second adhesive layer 22 and the first adhesive layer 21 laminated in order from the transparent substrate 20 side. That is, the adhesive sheet 14 shown in FIG. 4 has a layer structure in which an oxygen barrier layer 23 is further provided on the transparent substrate 20 of the adhesive sheet 11 shown in FIG. 2 or the adhesive sheet 13 shown in FIG. 13. The oxygen barrier layer 23, which will be described later, is a functional layer that blocks the penetration of oxygen into the first adhesive layer 21, thereby suppressing deterioration due to oxidation of the dye contained in the first adhesive layer 21. The adhesive sheet 14 with the transparent substrate 20 is used as an optical film to be bonded to the surface of the display panel, and typically, an optical functional layer is provided on the transparent substrate 20 to control incident light, as described later. The adhesive sheet 14 is used in a direction such that the first adhesive layer 21 is bonded to the display panel and the oxygen barrier layer 23 is on the viewing side of the display device. In the example of FIG. 4, the second adhesive layer 22 or the transparent substrate 20 included in the adhesive layer 30 functions as an ultraviolet absorbing layer by containing an ultraviolet absorber. A release film (not shown) may be detachably bonded to the surface of the first adhesive layer 21. The release film can protect the first adhesive layer 21 until the adhesive sheet 12 is used.

Figure 5:
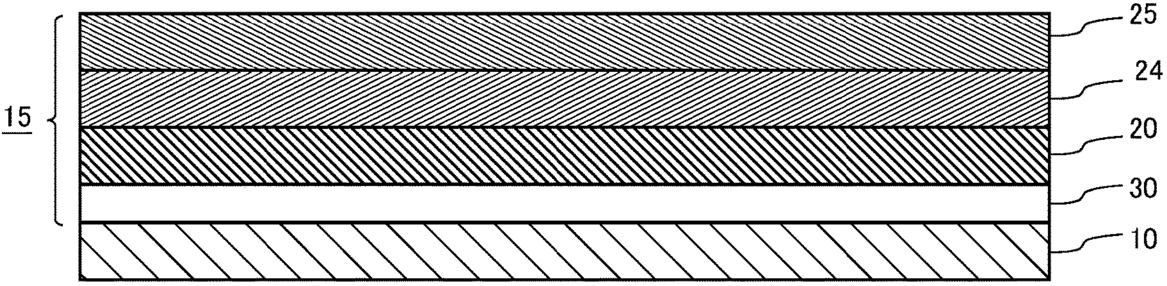
FIG. 5 is a cross-sectional view showing a schematic configuration of the display device according to the fifth embodiment.
Figure 6:
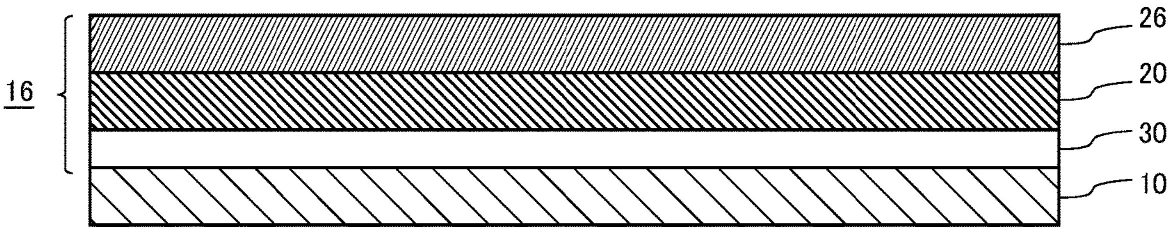
FIG. 6 is a cross-sectional view showing a schematic configuration of the display device according to the sixth embodiment.
Figure 7:
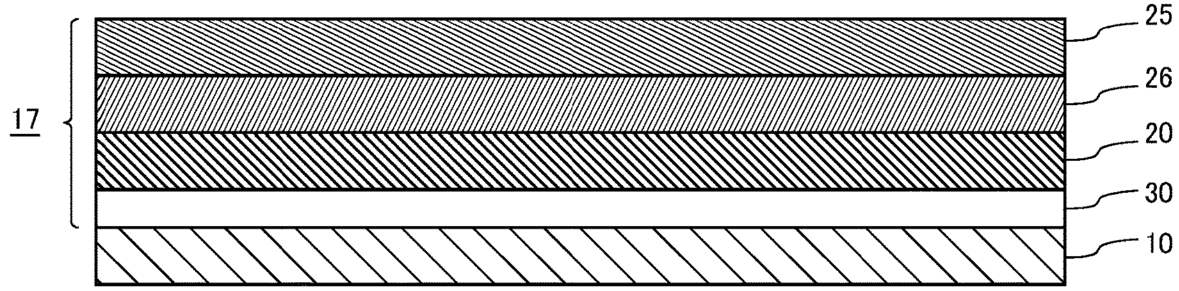
FIG. 7 is a cross-sectional view showing a schematic configuration of the display device according to the seventh embodiment.

FIGS. 5 to 7 are cross-sectional views showing schematic configurations of display devices according to fifth to seventh embodiments, respectively. The upper side in FIGS. 5 to 7 corresponds to the observation side when observing the display image of the display device.

The display device 1 shown in FIG. 5 has a display panel 10 and an adhesive sheet 15 provided on the display surface side of the display panel 10. The display panel 10 is a display panel having a light source, and is typically a self-luminous display panel such as an organic EL panel, a micro LED panel and the like. The adhesive sheet 15 has a transparent substrate 20, an adhesive layer 30 laminated on one surface of the transparent substrate 20, and a high refractive index layer 24 and a low refractive index layer 25 laminated on the other surface of the transparent substrate. The adhesive layer 30 shown in FIGS. 5 to 7 is the above-described first adhesive layer 21 or a laminate of the first adhesive layer and the second adhesive layer. The low refractive index layer 25 of the adhesive sheet 15 is the outermost surface on the viewing side of the display device 1, and the adhesive layer 30 is bonded to the display surface of the display panel 10. The refractive index of the low refractive index layer 25 is lower than that of the high refractive index layer 24, and the high refractive index layer 24 and the low refractive index layer 25 constitute an antireflection layer. The high-refractive-index layer 24 and the low-refractive-index layer 25 reduce the reflection of the external light by canceling the external light incident on the adhesive sheet 15 and the reflected light reflected between the layers in the adhesive sheet 15 by interference. That is, the adhesive sheet 15 shown in FIG. 5 is obtained by further providing an antireflection layer on the adhesive sheet 12 shown in FIG. 2 or the adhesive sheet 13 shown in FIG. 3.

The display device 2 shown in FIG. 6 has a display panel 10 and an adhesive sheet 16 provided on the display surface side of the display panel 10. The adhesive sheet 16 has a transparent substrate 20, an adhesive layer 30 laminated on one side of the transparent substrate 20, and an antiglare layer 26 laminated on the other side of the transparent substrate 20. The antiglare layer 26 of the adhesive sheet 16 is the outermost surface of the viewing side of the display device 2, and the adhesive layer 30 is bonded to the display surface of the display panel 10. The antiglare layer 26 is an optical functional layer for controlling reflection of external light, and reduces reflection of external light by scattering the external light with fine unevenness formed on the surface. That is, the adhesive sheet 16 shown in FIG. 6 is obtained by further providing an antiglare layer to the adhesive sheet 12 shown in FIG. 2 or the adhesive sheet 13 shown in FIG. 3.

The display device 3 shown in FIG. 7 has a display panel 10 and an adhesive sheet 17 provided on the display surface side of the display panel 10. The adhesive sheet 17 has a transparent substrate 20, an adhesive layer 30 laminated on one side of the transparent substrate 20, and an antiglare layer 26 and a low refractive index layer 25 laminated on the other side of the transparent substrate 20. The low refractive index layer 25 of the adhesive sheet 17 is the outermost surface on the viewing side of the display device 3, and the adhesive layer 30 is bonded to the display surface of the display panel 10. The antiglare layer 26 is an optical functional layer for controlling reflection of external light, and reduces reflection of external light by scattering the external light with fine unevenness formed on the surface. The refractive index of the low refractive index layer 25 is lower than that of the antiglare layer 26, and the antiglare layer 26 and the low refractive index layer 25 constitute an antireflection layer. That is, the adhesive sheet 17 shown in FIG. 7 is obtained by further providing an antiglare layer and an antireflection layer to the adhesive sheet 12 shown in FIG. 2 or the adhesive sheet 13 shown in FIG. 3.

Details of each layer included in the adhesive sheets 11 to 17 will be described below.

<First Adhesive Layer>

The first adhesive layer 21 is a layer for reducing reflection of external light by absorbing part of the external light incident on the first adhesive layer 21 and part of the reflected light that re-enters the first adhesive layer 21 after being reflected by the metal electrodes and reflective members of the display panel. The first adhesive layer 21 contains an adhesive and a dye that absorbs visible light. The adhesive is not particularly limited, but silicone-based adhesives, acrylic-based adhesives, urethane-based adhesives, and the like can be used. The first adhesive layer 21 contains a first coloring material and a second coloring material as dyes. The first coloring material has a maximum absorption wavelength in the range of 470 to 530 nm and a half width of the absorption spectrum of 15 to 45 nm, and the second coloring material has a maximum absorption wavelength in the range of 560 to 620 nm and a half width of the absorption spectrum of 15 to 55 nm. By using those having the above absorption property as the first coloring material and the second coloring material to be contained in the first adhesive layer 21, the first adhesive layer 21 can absorb visible light in a wavelength range with relatively low emission intensity, among the visible light emitted by the display panel.

Optical films used in display devices are generally provided with optical functional layers such as antireflection layers, antiglare layers and the like, and part of the incident external light is transmitted through these optical functional layers, reaches the display panel, and is reflected by metal electrodes and reflecting members present on the surface of the display panel. Since the light reflected inside the display device impairs the contrast and visibility of the displayed image on the display panel, conventionally, a circularly polarizing plate has been used to reduce the reflected light on the surface of the display panel 10. In the present invention, instead of reducing the reflected light by the circularly polarizing plate, the dye-containing first adhesive layer 21 absorbs part of the incident light. Some of the remaining incident light not absorbed by the first adhesive layer 21 is reflected by the display panel, but the first adhesive layer 21 absorbs some of the reflected light. This greatly reduces the internal reflectance of external light. Since the absorption wavelength regions of the two types of dyes contained in the first adhesive layer 21 do not overlap with the maximum wavelength of light emitted from the display panel, a decrease in intensity of light emitted from the display panel is suppressed.

Colorants, pigments, nanometals, and the like can be used as the dyes contained in the first adhesive layer 21, and it is preferable to use a coloring material containing one or more compounds selected from the group consisting of compounds having any one of a porphyrin structure, a merocyanine structure, a phthalocyanine structure, an azo structure, a cyanine structure, a squarylium structure, a coumarin structure, a polyene structure, a quinone structure, a tetraazaporphyrin structure, a pyrromethene structure and an indigo structure in the molecules, and metal complexes thereof. In particular, it is more preferable to use a metal complex having a porphyrin structure, a pyrromethene structure, or a phthalocyanine structure in its molecule.

Further, the first adhesive layer 21 may further contain a third coloring material having a maximum absorption wavelength within the range of 650 to 800 nm in addition to the above two coloring materials. However, as the third coloring material, a dye whose maximum absorption wavelength is different from the maximum emission wavelength of the display panel 10 is used. By including the third coloring material in the first adhesive layer 21, reflection of external light can be further reduced.

Although the thickness of the first adhesive layer 21 is not particularly limited, it is preferably about 5 to 100 μm, and more preferably about 10 to 60 μm.

<Second Adhesive Layer>

The second adhesive layer 22 is an ultraviolet absorbing layer containing an ultraviolet absorber in order to prevent deterioration due to oxidation of the dye contained in the first adhesive layer 21. The adhesive is not particularly limited, but silicone-based adhesives, acrylic-based adhesives, urethane-based adhesives, and the like can be used. Ultraviolet absorber compounds that can be used are described below.

Although the thickness of the second adhesive layer 22 is not particularly limited, it is preferably about 5 to 100 μm, and more preferably about 10 to 60 μm.

<Release Film>

When a release film is provided on the first adhesive layer 21 and/or the second adhesive layer 22, a known film obtained by coating the surface of a substrate made of a resin such as polyethylene terephthalate, polypropylene, polyethylene or the like with a silicone-based or non-silicone-based release agent to give easy-releasing can be used, as the release film.

<Transparent Substrate>

The transparent substrate 20 is made of a material having excellent visible light transmittance. As materials for forming the transparent substrate 20, transparent resins such as polyolefins such as polyethylene, polypropylene and the like; polyesters such as polyethylene terephthalate, polybutylene terephthalate, polyethylene naphthalate and the like; polyacrylates such as polymethyl methacrylate and the like; polyamides such as nylon 6, nylon 66 and the like; polyimide, polyarylate, polycarbonate, triacetyl cellulose, polyacrylate, polyvinyl alcohol, polyvinyl chloride, cycloolefin copolymer, norbornene-containing resin, polyethersulfone, polysulfone and the like; and inorganic glass can be used. Among these, a film made of polyethylene terephthalate can be suitably used. Although the thickness of the transparent substrate 20 is not particularly limited, it is preferably 10 to 100 μm.

As in the configuration shown in FIG. 2, when the second adhesive layer 22 is not provided, the transparent substrate 20 can be used as an ultraviolet absorbing layer, and in this case, the transparent substrate 20 contains a material having ultraviolet absorbability, and forms the layer. Since the transparent substrate 20 has ultraviolet absorbability, it is possible to suppress fading of the dye contained in the first adhesive layer 21.

<High Refractive Index Layer>

The high refractive index layer 24 can be formed by applying and curing a composition for forming high refractive index layer containing an active energy ray-curable resin, a photopolymerization initiator, and a solvent. The high refractive index layer 24 is typically constructed as a hard coat layer. The refractive index of the high refractive index layer 24 is preferably 1.50 to 2.40. Although the thickness of the high refractive index layer 24 is not particularly limited, it is preferably 2 to 10 μm. If the thickness of the high refractive index layer 24 is less than 2 μm, the hardness of the high refractive index layer 24 may be insufficient. If the thickness of the high refractive index layer 24 exceeds 10 μm, it is disadvantageous in reducing the thickness of the display device, which is not preferable. However, the coating thickness of the high refractive index layer 24 can be appropriately set according to the required surface hardness and overall thickness. Further, the high refractive index layer 24 may contain metal oxide fine particles for the purpose of adjusting the refractive index and imparting hardness. By blending metal oxide fine particles to the high refractive index layer 24 to increase the refractive index, an antireflection layer can be formed together with the low refractive index layer described later.

The active energy ray-curable resin is a resin that is polymerized and cured by irradiation with an active energy ray such as an ultraviolet ray, an electron beam or the like, and for example, monofunctional, bifunctional, or tri- or more-functional (meth)acrylate monomers can be used. In this specification, "(meth)acrylate" is a generic term for both acrylate and methacrylate, and "(meth)acryloyl" is a generic term for both acryloyl and methacryloyl.

Examples of monofunctional (meth)acrylate compounds include 2-hydroxyethyl (meth)acrylate, 2-hydroxypropyl (meth)acrylate, 2-hydroxybutyl (meth)acrylate, n-butyl (meth)acrylate, isobutyl (meth)acrylate, t-butyl (meth)acrylate, glycidyl (meth)acrylate, acryloylmorpholine, N-vinylpyrrolidone, tetrahydrofurfuryl acrylate, cyclohexyl (meth)acrylate, 2-ethylhexyl (meth)acrylate, isobornyl (meth)acrylate, isodecyl (meth)acrylate, lauryl (meth)acrylate, tridecyl (meth)acrylate, cetyl (meth)acrylate, stearyl (meth)acrylate, benzyl (meth)acrylate, 2-ethoxyethyl (meth) acrylate, 3-methoxybutyl (meth)acrylate, ethyl carbitol (meth)acrylate, phosphoric acid (meth)acrylate, ethylene oxide-modified phosphoric acid (meth)acrylate, phenoxy (meth)acrylate, ethylene oxide-modified phenoxy (meth) acrylate, propylene oxide-modified phenoxy (meth)acrylate, nonylphenol (meth)acrylate, ethylene oxide-modified nonylphenol (meth)acrylate, propylene oxide-modified nonylphenol (meth)acrylate, methoxydiethylene glycol (meth) acrylate, methoxypolyethylene glycol (meth)acrylate, methoxypropylene glycol (meth)acrylate, 2-(meth)acryloyloxyethyl-2-hydroxypropyl phthalate, 2-hydroxy-3-phenoxypropyl (meth)acrylate, 2-(meth)acryloyloxyethyl hydrogen phthalate, 2-(meth acryloyloxy propyl hydrogen phthalate, 2-(meth)acryloyloxypropyl hexahydrohydrogen phthalate, 2-(meth)acryloyloxypropyl tetrahydrohydrogen phthalate, dimethylaminoethyl (meth)acrylate, trifluoroethyl (meth)acrylate, tetrafluoropropyl (meth)acrylate, hexafluoropropyl (meth)acrylate, octafluoropropyl (meth)acrylate, adamantane derivative mono(meth)acrylates such as adamantyl acrylates having a monovalent mono(meth)acrylate derived from 2-adamantane, or adamantanediol, and the like.

Examples of bifunctional (meth)acrylate compounds include di(meth)acrylates such as ethylene glycol di(meth) acrylate, diethylene glycol di(meth)acrylate, butanediol di(meth)acrylate, hexanediol di(meth)acrylate, nonanediol di(meth)acrylates, ethoxylated hexanediol di(meth)acrylate, propoxylated hexanediol di(meth)acrylate, diethylene glycol di(meth)acrylate, polyethylene glycol di(meth)acrylate, tripropylene glycol di(meth)acrylate, polypropylene glycol di(meth)acrylate, neopentyl glycol di(meth)acrylate, ethoxylated neopentyl glycol di(meth)acrylate, tripropylene glycol di(meth)acrylate, neopentyl glycol hydroxypivalate di(meth)acrylate, and the like.

Examples of tri- or more-functional (meth)acrylate compounds include tri(meth)acrylates such as trimethylolpropane tri(meth)acrylate, ethoxylated trimethylolpropane tri(meth)acrylate, propoxylated trimethylolpropane tri(meth)acrylate, tris-2-hydroxyethyl isocyanurate tri(meth)acrylate, glycerin tri(meth)acrylate and the like; trifunctional (meth)acrylate compounds such as pentaerythritol tri(meth)acrylate, dipentaerythritol tri(meth)acrylate, ditrimethylolpropane tri(meth)acrylate and the like; tri- or more-polyfunctional (meth)acrylate compounds such as pentaerythritol tetra(meth)acrylate, ditrimethylolpropane tetra(meth)acrylate, dipentaerythritol tetra(meth)acrylate, dipentaerythritol penta(meth)acrylate, ditrimethylolpropane penta(meth)acrylate, dipentaerythritol hexa(meth)acrylate, ditrimethylolpropane hexa(meth)acrylate and the like, and polyfunctional (meth)acrylate compounds in which some of these (meth)acrylates are substituted with alkyl groups or ε-caprolactone.

Further, urethane (meth)acrylates can also be used as the active energy ray-curable resin. Examples of urethane (meth)acrylates include those obtained by reacting a (meth)acrylate monomer having a hydroxyl group with a product obtained by reacting a polyester polyol with an isocyanate monomer or a prepolymer.

Examples of urethane (meth)acrylates include pentaerythritol triacrylate hexamethylene diisocyanate urethane prepolymer, dipentaerythritol pentaacrylate hexamethylene diisocyanate urethane prepolymer, pentaerythritol triacrylate toluene diisocyanate urethane prepolymer, dipentaerythritol pentaacrylate toluene diisocyanate urethane prepolymer, pentaerythritol triacrylate isophorone diisocyanate urethane prepolymer, dipentaerythritol pentaacrylate isophorone diisocyanate urethane prepolymer, and the like.

One type of the active energy ray-curable resin described above may be used, or two or more types thereof may be used in combination. Further, the active energy ray-curable resin described above may be a monomer in the composition for forming high refractive index layer, or may be a partially polymerized oligomer.

As the photopolymerization initiator used in the composition for forming high refractive index layer, for example, 2,2-ethoxyacetophenone, 1-hydroxycyclohexylphenylketone, dibenzoyl, benzoin, benzoin methyl ether, benzoin ethyl ether, p-chlorobenzophenone, p-methoxybenzophenone, Michler's ketone, acetophenone, 2-chlorothioxanthone and the like can be used. One type of these may be used alone, or two or more types may be used in combination.

The solvents used in the composition for forming high refractive index layer include ethers such as dibutyl ether, dimethoxymethane, dimethoxyethane, diethoxyethane, propylene oxide, 1,4-dioxane, 1,3-dioxolane, 1,3,5-trioxane, tetrahydrofuran, anisole, phenetole and the like, ketones such as acetone, methylethylketone, diethylketone, dipropylketone, diisobutylketone, methylisobutylketone, cyclopentanone, cyclohexanone, methylcyclohexanone, methylcyclohexanone and the like, esters such as ethyl formate, propyl formate, n-pentyl formate, methyl acetate, ethyl acetate, methyl propionate, ethyl propionate, n-pentyl acetate, γ-butyrolactone and the like, and cellosolves such as methyl cellosolve, cellosolve, butyl cellosolve, cellosolve acetate and the like. These may be used singly or in combination of two or more.

In addition, for the purpose of adjusting the refractive index and imparting hardness, metal oxide fine particles that can be blended in the composition for forming high refractive index layer include zirconium oxide, titanium oxide, niobium oxide, antimony trioxide, antimony pentoxide, tin oxide, indium oxide, indium tin oxide, zinc oxide, and the like.

As other additives, a leveling agent, an antifoaming agent, an antioxidant, an ultraviolet absorber, a light stabilizer, a photosensitizer, a conductive material, and the like may be added to the composition for forming high refractive index layer.

<Low Refractive Index Layer>

The low refractive index layer 25 can be formed by applying a composition for forming low refractive index layer containing at least an active energy ray-curable resin to a transparent substrate and curing the composition. As the active energy ray-curable resin used in the composition for forming low refractive index layer, those described for the high refractive index layer can be used. Fine particles of LiF, MgF, 3NaF—AlF, AlF, $Na_3AlF_6$ or the like, or silica fine particles may be added to the composition for forming low refractive index layer for adjusting the refractive index. As the silica fine particles, it is effective to lower the refractive index of the low refractive index layer by using porous silica fine particles, hollow silica fine particles, or the like having voids inside the particles. The composition for forming low refractive index layer may also contain the photopolymerization initiator, solvent, and other additives described for the high refractive index layer as appropriate. The refractive index of the low refractive index layer 25 is preferably 1.20 to 1.55. Also, the coating thickness of the low refractive index layer 32 is not particularly limited, but is preferably 40 nm to 1 μm.

The low refractive index layer 25 may contain any one of silicon oxides, fluorine-containing silane compounds, fluoroalkylsilazanes, fluoroalkylsilanes, fluorine-containing silicon-based compounds, and perfluoropolyether group-containing silane coupling agents. These materials impart water repellency and/or oil repellency to the low refractive index layer 25, thereby enhancing an antifouling property.

<Anti-Glare Layer>

The antiglare layer 26 is a layer that has minute unevenness on the surface and reduces reflection of external light by scattering external light with the unevenness. The antiglare layer 26 can be formed by applying and curing a composition for forming antiglare layer containing an active energy ray-curable resin and organic fine particles and/or inorganic fine particles. As the active energy ray-curable resin used in the composition for forming antiglare layer, those described for the high refractive index layer can be used. Although the coating thickness of the antiglare layer 26 is not particularly limited, it is preferably 1 to 10 μm.

The organic fine particles are a material that mainly forms fine unevenness on the surface of the antiglare layer 26 and imparts a function of diffusing external light. As the organic fine particles, resin particles made of translucent resin materials such as acrylic resins, polystyrene resins, styrene-(meth)acrylic acid ester copolymers, polyethylene resins, epoxy resins, silicone resins, polyvinylidene fluoride, polyethylene fluoride resins and the like can be used. In order to adjust the refractive index and the dispersibility of the resin particles, two or more kinds of resin particles having different materials (refractive indexes) may be mixed and used.

The inorganic fine particles are a material mainly for adjusting sedimentation and agglomeration of organic fine particles in the antiglare layer 26. As the inorganic fine particles, silica fine particles, metal oxide fine particles, various mineral fine particles, and the like can be used. As the silica fine particles, for example, colloidal silica and silica fine particles surface-modified with reactive functional groups such as (meth)acryloyl groups and the like can be used. As the metal oxide fine particles, for example, alumina, zinc oxide, tin oxide, antimony oxide, indium oxide, titania, and zirconia and the like can be used. As the mineral fine particles, for example, mica, synthetic mica, vermiculite, montmorillonite, iron montmorillonite, bentonite, beidellite, saponite, hectorite, stevensite, nontronite, magadiite, islarite, kanemite, layered titanate, smectite, synthetic smectite and the like can be used. The mineral fine particles may be either natural products or synthetic products (including substituted products and derivatives), and a mixture of the two may be used. Among the fine mineral particles, layered organoclays are more preferred. The layered organic clay is a swelling clay in which an organic onium ion is introduced between layers. The organic onium ion is not limited as long as it can be organized by utilizing the cation exchange property of the swelling clay. When layered organoclay minerals are used as mineral fine particles, the synthetic smectites described above can be suitably used. Synthetic smectite has a function of increasing the viscosity of a coating liquid for forming an antiglare layer, suppressing the sedimentation of resin particles and inorganic fine particles, and adjusting the irregular shape of the surface of the optical functional layer.

The antiglare layer 26 may contain any one of silicon oxides, fluorine-containing silane compounds, fluoroalkylsilazanes, fluoroalkylsilanes, fluorine-containing silicon compounds, and perfluoropolyether group-containing silane coupling agents. These materials can enhance an antifouling property by imparting water repellency and/or oil repellency to the antiglare layer 26.

The antiglare layer 26 may be formed as a layer in which a layer with a relatively high refractive index and a layer with a relatively low refractive index are laminated in order from the first adhesive layer 21 side by unevenly distributing the material. The antiglare layer 26 in which the materials are unevenly distributed can be formed, for example, by coating a composition containing a low refractive index material containing surface-modified silica fine particles or hollow silica fine particles and a high refractive index material, and by separating phases using a difference in surface free energy between them. When the antiglare layer 26 is composed of two separated layers, it is preferable that the refractive index of the layer with a relatively high refractive index on the first adhesive layer 21 side is 1.50 to 2.40, and the refractive index of the layer with a relatively low refractive index on the surface side 1.20 to 1.55.

<Ultraviolet Absorbing Layer>

In the adhesive sheets 11 to 17 according to the embodiment, an ultraviolet absorbing layer is provided above the first adhesive layer (observation side) in order to suppress deterioration of the dye contained in the first adhesive layer 21. The ultraviolet shielding rate of the ultraviolet absorbing layer is preferably 85% or more. Here, the ultraviolet shielding rate is a value measured according to JIS L 1925, and calculated by the following formula.

Ultraviolet shielding rate (%)=100−average transmittance of ultraviolet rays with a wavelength of 290 to 400 nm (%)

The ultraviolet absorbing layer can be composed of the second adhesive layer 22 or the transparent substrate 20 provided on the observation side of the first adhesive layer 21. However, instead of the second adhesive layer 22 or the transparent substrate 20, or in addition to the second adhesive layer 22 or the transparent substrate 20, any layer provided on the observation side than the first adhesive layer 21 may be allowed to contain an ultraviolet absorber to provide an ultraviolet absorbing layer. Further, in examples of FIGS. 4 to 7, any one or more of the oxygen barrier layer 23, the high refractive index layer 24, the low refractive index layer 25 and the antiglare layer 26 may be allowed to contain an ultraviolet absorber, to give an ultraviolet absorbing layer.

Although the ultraviolet absorber is not particularly limited, benzophenone-based, benzotriazole-based, triazine-based, oxalic acid anilide-based, and cyanoacrylate-based compounds can be used. Since the ultraviolet absorber is added to suppress the deterioration of the dye contained in the first adhesive layer 21, those that absorb light in a wavelength range that contributes to deterioration of the dye contained in the first adhesive layer 21, among the ultraviolet range, are used.

When the ultraviolet absorbing layer is formed by applying and curing a photopolymerizable composition containing an ultraviolet absorber, if the amount of ultraviolet light absorption by the ultraviolet absorber is too large, curing of the composition will be insufficient, and the surface hardness of the resultant adhesive sheet is insufficient. Therefore, when forming an ultraviolet absorbing layer using a photopolymerizable composition containing an ultraviolet absorber, by using an ultraviolet absorber whose absorption wavelength range in the ultraviolet region is different from that of the photopolymerization initiator in the ultraviolet region, inhibition of curing when the ultraviolet absorber is contained can be suppressed. The absorption wavelength range of the ultraviolet absorber in the ultraviolet region is preferably in the range of 290 to 370 nm. When the absorption wavelength range of the ultraviolet absorber to be contained in any layer constituting the ultraviolet absorbing layer is set to this range, an acylphosphine oxide-based photopolymerization initiator having a different absorption wavelength range from the wavelength range can be suitably used. Examples of the acylphosphine oxide-based photopolymerization initiator include diphenyl(2,4,6-trimethylbenzoyl)phosphine oxide, phenylbis(2,4,6-trimethylbenzoyl) phosphine oxide, and the like. By making the absorption wavelength regions of the ultraviolet absorber and the photopolymerization initiator different, it is possible to suppress curing inhibition when forming the ultraviolet absorbing layer containing the ultraviolet absorber, and after curing, it is possible to suppress deterioration of the dye contained in the first adhesive layer 21 due to by ultraviolet rays <Oxygen Barrier Layer>

The oxygen permeability of the oxygen barrier layer 23 is 10 cc/($m^2$*day*atm) or less, more preferably 5 cc/($m^2$*day*atm) or less, and further preferably 1 cc/($m^2$*day*atm) or less. Due to the oxygen barrier property of the oxygen barrier layer 23, it is possible to suppress oxidative deterioration (fading) of the coloring material contained in the first adhesive layer 21. As the material for forming the oxygen barrier layer 23, those containing polyvinyl alcohol (PVA), ethylene-vinyl alcohol copolymer (EVOH), vinylidene chloride, siloxane resin and the like are preferable, and MAXIVE (registered trademark) manufactured by Mitsubishi Gas Chemical Company, Inc., EVAL manufactured by Kuraray Co., Ltd., Saran Latex and Saran Resin manufactured by Asahi Kasei Corporation, and the like, can be used. Moreover, the thickness of the oxygen barrier layer 23 is not particularly limited, and may be set to a thickness that provides the desired oxygen barrier property.

Inorganic particles (particles made of an inorganic compound) may be dispersed in the oxygen barrier layer 23. Oxygen permeability can be further reduced, and oxidative deterioration (fading) of the first adhesive layer 21 can be further suppressed, by the inorganic particles. The size and content of the inorganic particles are not particularly limited, and may be appropriately set according to the thickness of the oxygen barrier layer 23 and the like. The size (maximum length) of the inorganic particles dispersed in the oxygen barrier layer 23 is preferably less than the thickness of the oxygen barrier layer 23, and the smaller the size, the more advantageous. The size of the inorganic particles dispersed in the oxygen barrier layer 23 may be uniform or non-uniform. Specific examples of the inorganic particles dispersed in the oxygen barrier layer 23 include silica particles, alumina particles, silver particles, copper particles, titanium particles, zirconia particles, tin particles, and the like.

The oxygen barrier layer 23 may be laminated above the first adhesive layer 21 on the viewer side. Therefore, as shown in FIG. 4, the oxygen barrier layer 23 may be laminated on the surface of the transparent substrate 20 opposite to the surface on which the first adhesive layer 21 is provided, or may be laminated between the transparent substrate 20 and the first adhesive layer 21. For example, in the adhesive sheet 15 according to the fifth embodiment, an oxygen barrier layer may be further provided between the transparent substrate 20 and the low refractive index layer 25. Moreover, in the adhesive sheet 16 according to the sixth embodiment, an oxygen barrier layer may be further provided between the transparent substrate 20 and the antiglare layer 26. Moreover, in the adhesive sheet 17 according to the seventh embodiment, an oxygen barrier layer may be further provided between the transparent substrate 20 and the low refractive index layer 25. In the layer constitutions of FIGS. 5 to 7, an oxygen barrier layer may be provided between the transparent substrate 20 and the first adhesive layer 21 (adhesive layer 30). By further providing an oxygen barrier layer, fading due to oxidation of the dye can be further suppressed as in the fourth embodiment.

<Composition for Forming Adhesive Layer>

The above-described first adhesive layer 21 can be formed by applying a composition for forming adhesive layer containing an adhesive, a dye, and an additive and a solvent optionally blended to a support such as a release film or a transparent substrate, and if necessary, drying the composition. As the dye, the first coloring material and the second coloring material having the above-described absorption property may be used, and if necessary, the third coloring material having the above-described absorption property may be further blended. At least one of a radical scavenger, a singlet oxygen quencher and a peroxide decomposer can be used as the additive.

The radical scavenger has a function of scavenging radicals when the dye is oxidatively deteriorated, and has a function of suppressing autoxidation, thereby suppressing dye deterioration (fading). When a hindered amine light stabilizer having a molecular weight of 2000 or more is used as the radical scavenger, a high effect of suppressing fading can be obtained. When the molecular weight of the radical scavenger is low, it is easy to volatilize, so few molecules remain in the first adhesive layer, making it difficult to obtain a sufficient anti-fading effect. Examples of materials suitably used as radical scavengers include Chimasorb 2020FDL, Chimasorb 944FDL, and Tinuvin 622 manufactured by BASF, and LA-63P manufactured by ADEKA, and the like.

The singlet oxygen quencher has a function of deactivating highly reactive singlet oxygen, which tends to cause oxidative deterioration (fading) of a dye, and suppressing oxidative deterioration (fading) of the dye. The singlet oxygen quencher includes transition metal complexes, dyes, amines, phenols, and sulfides, and particularly preferred materials include transition metal complexes of dialkyl phosphate, dialkyldithiocarbamate or benzenedithiol, or similar dithiol, and as the central metal thereof, nickel, copper or cobalt is preferably used.

The peroxide decomposer has a function of decomposing a peroxide generated when a dye is oxidatively deteriorated, stopping the auto-oxidation cycle, and suppressing the dye deterioration (fading). Phosphorus-based antioxidants and sulfur-based antioxidants can be used as the peroxide decomposer.

Examples of the phosphorus-based antioxidant include 2,2'-methylenebis(4,6-di-t-butyl-1-phenyloxy)(2-ethylhexyloxy)phosphorus, 3,9-bis(2,6-di-tert-butyl-4-methylphenoxy)-2,4,8,10-tetraoxa-3,9-diphosphaspiro[5.5]undecane, and 6-[3-(3-t-butyl-4-hydroxy-5-methylphenyl) propoxy]-2,4,8,10-tetra-t-butyldibenz[d,f][1,3,2]dioxaphosphepine, and the like.

Examples of the sulfur-based antioxidant include 2,2-bis({[3-(dodecylthio)propionyl]oxy}methyl)-1,3-propanediyl-bis[3-(dodecylthio)propionate], 2-mercaptobenz imidazole, dilauryl-3,3'-thiodipropionate, dimyristyl-3,3'-thiodipropionate, distearyl-3,3'-thiodipropionate, pentaerythrityl-tetrakis(3-laurylthiopropionate), 2-mercaptobenzimidazole, and the like.

As described above, the adhesive sheets 11 to 17 according to the present invention are provided with the first adhesive layer 21 containing a dye having visible light absorbability. Since part of the external light incident on the display device is absorbed by the first adhesive layer 21 in a process of passing through the first adhesive layer 21 and entering the display panel, and a process of being reflected by the display panel and re-transmitting the first adhesive layer 21, the intensity of the reflected light of external light is reduced. Thereby, the contrast and visibility of the display image of the display device can be improved. Further, by providing an ultraviolet absorbing layer in any layer on the viewing side than the first adhesive layer 21, it is possible to suppress fading of the dye and maintain the display performance of the display device.

In addition, when the adhesive sheets 11 to 17 according to the present invention are used, the transmittance of visible light emitted from the display panel can be set to 50% or more depending on the selection and blending amount of the dye, the luminance of the display device can be improved compared to the conventional configuration using a circularly polarizing plate without increasing the emission strength of the display panel. In addition, since it is not necessary to increase the emission intensity of the display panel to improve the luminance, the durability of the display panel can be improved. In addition, since the coating of the first adhesive layer 21 can realize the function of cutting visible light by the circularly polarizing plate, the thickness of the display device can be reduced as compared with the case of using the circularly polarizing plate.

An antifouling layer may be provided on the outermost surface of the adhesive sheet according to each of the above embodiments. The antifouling layer enhances the antifouling property by imparting water repellency and/or oil repellency to the optical layered body, and can be formed by dry-coating or wet-coating a silicon oxide, a fluorine-containing silane compound, a fluoroalkylsilazane, a fluoroalkylsilane, a fluorine-containing silicon-based compound, a perfluoropolyether group-containing silane coupling agent, or the like.

Further, an antistatic layer may be provided on the adhesive sheet according to each of the above embodiments. The antistatic layer can be formed by applying a coating liquid containing an ionizing radiation-curable material such as a polyester acrylate-based monomer, an epoxy acrylate-based monomer, an urethane acrylate-based monomer, a polyol acrylate-based monomer or the like, a polymerization initiator, and an antistatic agent, and curing through polymerization. As the antistatic agent, for example, metal oxide-based fine particles such as antimony-doped tin oxide (ATO), tin-doped indium oxide (ITO) and the like, polymeric conductive compositions, quaternary ammonium salts, and the like, can be used. The antistatic layer may be provided on the outermost surface of the optical laminate, or may be provided between the optical functional layer and the transparent substrate. Alternatively, the antistatic layer may be formed by adding an antistatic agent to any one of the layers constituting the optical functional layer described above. When the antistatic layer is provided, the surface resistance value is preferably $1.0\times10^{6}$ to $1.0\times10^{12}$ (Ω/cm).

In addition, in the adhesive sheet according to the fifth embodiment, a medium refractive index layer may be further provided between the high refractive index layer and the transparent substrate in order to improve the performance of the antireflection layer. Similarly, in the adhesive sheet according to the seventh embodiment, a medium refractive index layer may be further provided between the antiglare layer and the transparent substrate. In these cases, the layers may be laminated in order from the transparent substrate side in the order of a medium refractive index layer, a high refractive index layer (a layer functioning as a high refractive index layer), and a low refractive index layer. The medium refractive index layer can be formed by applying a composition for forming medium refractive index layer containing at least an active energy ray-curable resin to a transparent substrate and curing the composition. As the active energy ray-curable resin used in the composition for forming low refractive index layer, those described for the high refractive index layer can be used. Metal fine particles such as zirconium oxide, titanium oxide, niobium oxide, antimony trioxide, antimony pentoxide, tin oxide, indium oxide, indium tin oxide, zinc oxide and the like may be blended in the composition for forming medium refractive index layer for adjusting the refractive index. In addition, the composition for forming medium refractive index layer may be appropriately blended with the photopolymerization initiator, solvent, and other additives described for the hard coat layer.

In addition, aside from the high refractive index layer and the antiglare layer, the adhesive sheet according to each of the above embodiments may be provided with a hard coat layer to impart surface hardness. The hard coat layer can be formed by applying and curing a composition containing the active energy ray-curable resin described for the high refractive index layer.

EXAMPLES

Examples are described below. However, the present invention is not limited by the following examples.

In the following examples and comparative examples, adhesive sheets 1 to 16 having layer constitutions shown in Tables 1A, 1B, 2A and 2B were produced, and the properties of the produced adhesive sheets were evaluated. Moreover, the display device property of the organic EL display panel using the adhesive sheet was confirmed by simulation.

TABLE 1A

| | | Example 1 | Example 2 | Example 3 | Example 4 |
|---|---|---|---|---|---|
| adhesive sheet | | adhesive sheet 1 | adhesive sheet 2 | adhesive sheet 3 | adhesive sheet 4 |
| | functional layer 1 | low refractive index layer | low refractive index layer | low refractive index layer | low refractive index layer |
| | functional layer 2 | hard coat layer 1 | hard coat layer 2 | hard coat layer 1 | hard coat layer 1 |
| | functional layer 3 | — | — | — | — |
| | substrate | PMMA2 | PMMA2 | TAC | TAC |
| | second adhesive layer | adhesive layer 2 | — | | |
| | first adhesive layer | adhesive layer 1 | adhesive layer 1 | adhesive layer 1 | adhesive layer 3 |
| | adherend | glass | glass | glass | glass |

TABLE 1B

| | | Example 5 | Example 6 | Example 7 | Example 8 |
|---|---|---|---|---|---|
| adhesive sheet | | adhesive sheet 5 | adhesive sheet 6 | adhesive sheet 7 | adhesive sheet 8 |
| | functional layer 1 | low refractive index layer | low refractive index layer | low refractive index layer | low refractive index layer |
| | functional layer 2 | hard coat layer 1 | hard coat layer 1 | hard coat layer 1 | hard coat layer 1 |
| | functional layer 3 | — | — | oxygen barrier layer | — |
| | substrate | TAC | TAC | TAC | PMMA1 |
| | second adhesive layer | | | | — |
| | first adhesive layer | adhesive layer 4 | adhesive layer 5 | adhesive layer 1 | adhesive layer 5 |
| | adherend | glass | glass | glass | glass |

TABLE 2A

| | | Example 9 | Example 10 | Example 11 | Example 12 |
|---|---|---|---|---|---|
| adhesive sheet | | adhesive sheet 9 | adhesive sheet 10 | adhesive sheet 11 | adhesive sheet 12 |
| | functional layer 1 | low refractive index layer | low refractive index layer | low refractive index layer | |
| | functional layer 2 | hard coat layer 1 | hard coat layer 1 | hard coat layer 1 | antiglare layer 1 |
| | functional layer 3 | — | — | — | — |
| | substrate | PET1 | PET2 | TAC | TAC |
| | second adhesive layer | — | — | — | |
| | first adhesive layer | adhesive layer 5 | adhesive layer 5 | adhesive layer 6 | adhesive layer 1 |
| | adherend | glass | glass | glass | glass |

TABLE 2B

| | | Example 13 | Comparative Example 1 | Comparative Example 2 | Comparative Example 3 |
|---|---|---|---|---|---|
| adhesive sheet | | adhesive sheet 13 | adhesive sheet 14 | adhesive sheet 15 | adhesive sheet 16 |
| | functional layer 1 | | low refractive index layer | low refractive index layer | low refractive index layer |
| | functional layer 2 | hard coat layer 1 | hard coat layer 1 | hard coat layer 1 | hard coat layer 1 |
| | functional layer 3 | — | — | — | — |
| | substrate | TAC | PMMA2 | PMMA2 | PMMA2 |
| | second adhesive layer | | — | — | adhesive layer 2 |
| | first adhesive layer | adhesive layer 1 | adhesive layer 1 | adhesive layer 7 | — |
| | adherend | glass | glass | glass | glass |

<Production of Adhesive Sheet>

A method for forming each layer will be described below.

(Substrate)

The following materials were used as the transparent substrate.

TAC:
- triacetyl cellulose film (TG60UL manufactured by FUJIFILM Corporation substrate thickness 60 μm, UV shielding rate 92.9%)

PMMA1:
- polymethyl methacrylate film (W001U80 manufactured by Sumitomo Chemical Co., Ltd., substrate thickness 80 μm, UV shielding rate 93.4%)

PMMA2:
- polymethyl methacrylate film (W002N80 manufactured by Sumitomo Chemical Co., Ltd., substrate thickness 80 μm, UV shielding rate 13.9%)

PET1:
- polyethylene terephthalate film (SRF manufactured by Toyobo Co., Ltd., substrate thickness 80 μm, UV shielding rate 88.3%)

PET2:
- polyethylene terephthalate film (TOR20 manufactured by SKC, substrate thickness 40 μm, UV shielding rate 88.6%)

(Production of Optical Functional Layer)

[Formation of Oxygen Barrier Layer]

An 80% aqueous solution of PVA117 (manufactured by Kuraray Co., Ltd.) was applied onto the transparent substrate of Example 7 shown in Table 1B and dried to form an oxygen barrier layer having an oxygen permeability of 1 cc/($m^2$*day*atm).

[Formation of Hard Coat Layer]

(Composition for Forming Hard Coat)

The compositions shown in Table 3 were prepared using the followings as materials used for the composition for forming hard coat layer used to form a hard coat layer.

Active energy ray-curable resin:
- UA-306H (manufactured by Kyoeisha Chemical Co., Ltd., pentaerythritol triacrylate hexamethylene diisocyanate: urethane prepolymer)
- DPHA (dipentaerythritol hexaacrylate)
- PETA (pentaerythritol triacrylate)

Initiator:
- Omnirad: TPO (manufactured by IGM Resins B.V.)

Solvent:
- MEK (methyl ethyl ketone)
- methyl acetate

TABLE 3

| | | hard coat layer 1 | hard coat layer 2 |
|---|---|---|---|
| active energy ray-curable resin | type | UA-306H/DPHA/PETA | UA-306H/DPHA/PETA |
| | ratio | 70/20/10 | 70/20/10 |
| | addition amount | 45.4% | 42.2% |
| photopolymerization initiator | type | Omnirad TPO | Omnirad TPO |
| | addition amount | 4.6% | 4.6% |
| ultraviolet absorber | type | — | Tinuvin479/LA36 |
| | ratio | — | 40/60 |
| | addition amount | — | 3% |
| solvent | type | MEK/methyl acetate | MEK/methyl acetate |
| | ratio | 50/50 | 50/50 |
| | addition amount | 50% | 50% |

The composition for forming hard coat layer shown in Table 3 was applied onto the transparent substrate or oxygen barrier layer shown in Tables 1A, 1B, 2A and 2B, dried in an oven at 80° C. for 60 seconds, and then, irradiated with ultraviolet ray using an ultraviolet irradiation device at an irradiation dose of 150 mJ/$cm^2$ (light source H bulb manufactured by Fusion UV Systems Japan Co., Ltd.) to cure the coating, to form hard coat layers 1 and 2 described in Tables 1A, 1B, 2A and 2B.

[Formation of Low Refractive Index Layer]

(Composition for Forming Low Refractive Index Layer)

The following composition was used as a composition for forming low refractive index layer used for forming a low refractive index layer.

Refractive index adjuster:

porous silica fine particle dispersion (average particle size 75 nm, solid content 20%, solvent methyl isobutyl ketone) 8.5 parts by mass Anti-fouling agent:

OPTOOL AR-110 (manufactured by Daikin Industries, Ltd., solid content 15%, solvent methyl isobutyl ketone) 5.6 parts by mass Active energy ray-curable resin:

pentaerythritol triacrylate 0.4 parts by mass

Initiator:

Omnirad: 184 (manufactured by IGM: Resins B.V.) 0.07 parts by mass

Leveling Agent:

RS-77 (manufactured by DIC) 1.7 parts by mass

Solvent:

methyl isobutyl ketone 83.73 parts by mass

The composition for forming low refractive index layer having the above composition was applied on the hard coat layers shown in Tables 1A, 1B, 2A and 2B, and dried in an oven at 80° C. for 60 seconds, and irradiated with ultraviolet ray using an ultraviolet irradiation device at an irradiation dose of 200 mJ/cm$^2$ (light source H bulb manufactured by Fusion UV Systems Japan Co., Ltd.) to cure the coating, to form low refractive index layers described in Tables 1A, 1B, 2A and 2B having a coating thickness after curing of 100 nm.

[Formation of Antiglare Layer]

(Composition for Forming Antiglare Layer)

The compositions shown in Table 4 were prepared using the following materials as the materials for the composition for forming antiglare layer used for forming an antiglare layer.

Active energy ray-curable resin:

Light acrylate PE-3A (manufactured by Kyoeisha Chemical Co., Ltd., refractive index 1.52)

Photopolymerization initiator:

Omnirad: TPO (manufactured by IGM Resins B.V.)

Resin particles:

Styrene-methyl methacrylate copolymer particles (refractive index 1.515, average particle size 2.0 μm)

Inorganic Fine Particles 1:

synthetic smectite

Inorganic fine particles 2:

alumina nanoparticles, average particle size 40 nm

Solvent:

toluene isopropyl alcohol

TABLE 4

| | | antiglare layer 1 |
|---|---|---|
| active energy ray-curable resin | type | PE-3A |
| | ratio | 100 |
| | addition amount | 43.7% |
| organic fine particle | type | styrene-methyl methacrylate copolymer particle |
| | addition amount | 0.5% |

TABLE 4-continued

| | | antiglare layer 1 |
|---|---|---|
| inorganic fine particle | type | synthetic smectite/alumina nano particle |
| | ratio | 20/80 |
| | addition amount | 1.25% |
| photopolymerization initiator | type | Omnirad TPO |
| | addition amount | 4.55% |
| solvent | type | toluene/isopropyl alcohol |
| | ratio | 30/70 |
| | addition amount | 50% |

On the transparent substrate of Example 12 shown in Table 2A, the composition for forming antiglare layer shown in Table 4 was applied, dried in an oven at 80° C. for 60 seconds, and then, irradiated with ultraviolet ray using an ultraviolet irradiation device at an irradiation dose of 150 mJ/cm$^2$ (light source H bulb manufactured by Fusion UV Systems Japan Co., Ltd.) to cure the coating, to form an antiglare layer in Table 2A having a coating thickness of 5.0 μm after curing.

[Formation of First and Second Adhesive Layers]

(Production of Base Adhesive)

The following composition was used as the base adhesive.

Adhesive resin:

solution of butyl acrylate (BA)/hydroxyethyl methacrylate (HEMA) copolymer dissolved in ethyl acetate 70 parts by mass of Curing agent:

isocyanate-based cross-linking agent 0.037 parts by mass

Additive:

silane coupling agent 0.048 parts by mass

Solvent:

MEK (methyl ethyl ketone) \ 30 parts by mass (Compositions for Forming First and Second Adhesive Layers)

Compositions shown in Tables 5A and 5B were prepared using the followings as materials for the compositions for forming adhesive layer used to form the first and second adhesive layers. The maximum absorption wavelength and half width of the coloring material were calculated from the spectral transmittance of the property values in the adhesive layer.

First coloring material:

Dye-1: pyromethene cobalt complex colorant represented by chemical formula 1 described later (maximum absorption wavelength 493 nm, half width: 26 nm)

Second coloring material:

DYE-2: tetraazaporphyrin copper complex colorant (PD-311S manufactured by Yamamoto Chemicals, Inc., maximum absorption wavelength: 584 nm, half width: 17 nm)

Third coloring material:

Dye-3: phthalocyanine copper complex colorant (FDN-002: manufactured by Yamada Chemical Co., Ltd., maximum absorption wavelength: 800 nm)

Additive:

hindered amine light stabilizer: Chimassorb 944FDL (manufactured by BASF Japan, molecular weight: 2000 to 3100)

hindered amine light stabilizer: Tinuvin249 (manufactured by BASF Japan, molecular weight: 482)

singlet oxygen quencher: D1781 (manufactured by Tokyo Chemical Industry Co., Ltd.)

Ultraviolet absorber:
Tinuvin479 (manufactured by BASF Japan, maximum absorption wavelength: 322 nm)
LA-36 (manufactured by ADEKA, maximum absorption wavelength: 310 nm, 350 nm)
Adhesive:
base adhesive prepared above
Solvent:
ethyl acetate Chemical Formula 1

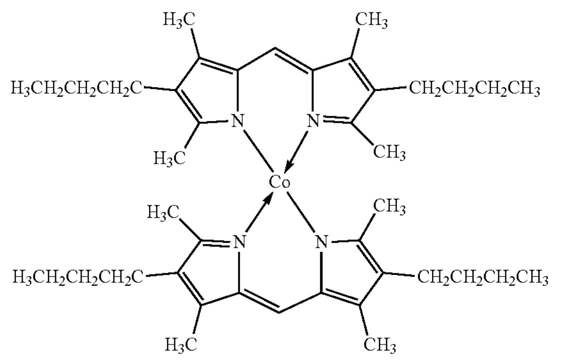

TABLE 5A

| | | adhesive layer 1 | adhesive layer 2 | adhesive layer 3 | adhesive layer 4 | adhesive layer 5 |
|---|---|---|---|---|---|---|
| coloring material | first coloring material | | | Dye-1 | | |
| coloring material | addition amount | | | 0.04% | | |
| | second coloring material | | | Dye-2 | | |
| | addition amount | | | 0.21% | | |
| | third coloring material | | | — | | |
| | addition amount | | | — | | |
| addtive | type | — | Tinuvin479/LA36 | Chimassorb 944FDL | Tinuvin249 | Chimassorb 944FDL/D1781 |
| | ratio | — | 40/60 | 100 | 100 | 67/33 |
| | addition amount | — | 0.77% | 0.35% | 0.35% | 0.52% |
| adhesive | addition amount | 85.32% | 84.23% | 84.83% | 84.83% | 84.58% |
| ethyl acetate | addition amount | 14.43% | 14.75% | 14.57% | 14.57% | 14.65% |

TABLE 5B

| | | adhesive layer 6 | adhesive layer 7 |
|---|---|---|---|
| coloring material | first coloring material | Dye-1 | — |
| | addition amount | 0.02% | — |
| | second coloring material | Dye-2 | — |
| | addition amount | 0.12% | — |
| | third coloring material | Dye-3 | — |
| | addition amount | 0.54% | — |
| addtive | type | — | Tinuvin479/LA36 |
| | ratio | — | 40/60 |
| | addition amount | — | 0.77% |
| adhesive | addition amount | 84.72% | 84.59% |
| ethyl acetate | addition amount | 14.61% | 14.65% |

TABLE 5B-continued (Production of Adhesive Layer and Adhesive Sheet)

The adhesive obtained as described above was applied to a release substrate film so as to have a dry coating thickness of 25 μm, dried sufficiently, and then, laminated with a release film to obtain an adhesive layer. The release film on one side of the obtained adhesive layer was peeled off, and bonded to a non-alkaline glass support having a thickness of 0.7 mm. After that, the release film on the other side of the adhesive layer was peeled off, and the substrates laminated with the functional layers shown in Tables 1A, 1B, 2A and 2B were bonded to obtain adhesive sheets 1 to 16.

[Evaluation of Adhesive Sheet Property]

(Ultraviolet Shielding Rate of the Layer Above the First Adhesive Layer)

The transmittance of the laminates above the first adhesive layer in Examples 1 to 13 and Comparative Examples 1 to 3 was measured using an automatic spectrophotometer (U-4100, manufactured by Hitachi, Ltd.). Using these transmittances, the average transmittance in the ultraviolet region (290 to 400 nm) was calculated, and the ultraviolet shielding rate shown in formula (1) was calculated.

Ultraviolet shielding rate (%)=100−average transmittance (%) in the ultraviolet region (290 to 400 nm)    Formula (1)

(Light Resistance Test)

Reliability of the obtained adhesive sheet was tested using a xenon weather meter tester (manufactured by Suga Test Instruments Co., Ltd., X75) for 120 hours at a xenon lamp illuminance of 60 W/cm$^2$ (30 to 400 nm), a temperature in the tester of 45° C. and a relative humidity of 50%, and before and after the test, the transmittance was measured using an automatic spectrophotometer (U-4100, manufactured by Hitachi, Ltd.), and the transmittance difference ΔTλ1 before and after the test at wavelength Al showing the minimum transmittance before test in the wavelength range of 470 to 530 nm, and the transmittance difference ΔTλ2 before and after the test at wavelength 22 showing the minimum transmittance before test in the wavelength range of 560 to 620 nm, and the color difference ΔEab with C light source before and after the test were calculated. The transmittance difference and the color difference close to zero are preferable, and ΔEab≤5 is preferable.

The results of evaluating the above items are shown in Tables 6A, 6B, 7A and 7B.

TABLE 6A

| | | Example 1 | Example 2 | Example 3 | Example 4 |
|---|---|---|---|---|---|
| ultriviolet shielding rate on first adhesive layer | | 92.0% | 91.4% | 93.0% | 93.0% |
| light resistance | ⊿Tλ1 | 22.6 | 22.0 | 22.1 | 13.4 |
| of adhesive | ⊿Tλ2 | 7.0 | 7.5 | 4.7 | 4.0 |
| layer | ⊿Eab | 4.8 | 4.8 | 4.9 | 3.3 |

TABLE 6B

| | | Example 5 | Example 6 | Example 7 | Example 8 |
|---|---|---|---|---|---|
| ultriviolet shielding rate on first adhesive layer | | 93.0% | 93.0% | 93.0% | 93.5% |
| light resistance | ⊿Tλ1 | 20.7 | 6.5 | 6.2 | 6.5 |
| of adhesive | ⊿Tλ2 | 4.4 | 1.9 | 3.5 | 1.6 |
| layer | ⊿Eab | 4.8 | 2.9 | 1.6 | 3.0 |

TABLE 7A

| | | Example 9 | Example 10 | Example 11 | Example 12 |
|---|---|---|---|---|---|
| ultriviolet shielding rate on first adhesive layer | | 88.5% | 88.8% | 93.0% | 92.8% |
| light | ⊿Tλ1 | 8.3 | 8.3 | 7.0 | 21.8 |
| resistance | ⊿Tλ2 | 5.0 | 4.2 | 2.2 | 4.5 |
| of colored layer | ⊿Eab | 2.1 | 2.0 | 3.0 | 4.8 |

TABLE 7B

| | | Example 13 | Comparative Example 1 | Comparative Example 2 | Comparative Example 3 |
|---|---|---|---|---|---|
| ultriviolet shielding rate on first adhesive layer | | 93.0% | 19.6% | 19.6% | — |
| light | ⊿Tλ1 | 22.2 | 43.0 | 49.1 | — |
| resistance | ⊿Tλ2 | 4.8 | 49.7 | 29.5 | — |
| of colored layer | ⊿Eab | 4.9 | 13.7 | 10.6 | — |

According to the results of Tables 6A, 6B, 7A, and 7B, the light resistance of the adhesive layer containing the first coloring material and the second coloring material was greatly improved by providing an upper layer with an ultraviolet absorbing layer having an ultraviolet shielding rate of 85% or more. Providing the adhesive layer with ultraviolet absorbability has little effect, and it is necessary to form another layer on the upper layer. Furthermore, the light resistance was further improved by lamination of an oxygen barrier layer and inclusion of a high molecular weight hindered amine light stabilizer as a radical scavenger and a dialkyldithiocarbamate nickel complex as a singlet oxygen quencher in the adhesive layer.

[Evaluation of Display Device Property]

The obtained adhesive sheets 6, 11, 13 and 16 were evaluated as follows.

(White Display Transmission Property)

The transmittance of the resulting adhesive sheet was measured using an automatic spectrophotometer (U-4100, manufactured by Hitachi, Ltd.), and the transmittance was used to calculate the efficiency of light transmitted through the optical film during white display, and it was evaluated as the white display transmission property. As a reference, the efficiency of the spectrum at the time of white display output through the white organic EL light source having the spectrum shown in FIG. 8 and the color filter was taken as 100.

(Display Device Reflection Property)

The transmittance of the obtained adhesive sheet was measured using an automatic spectrophotometer (U-4100, manufactured by Hitachi, Ltd.). The reflectance of the display panel was taken as 40%, the surface reflectance R when the adhesive sheet was provided with an antireflection layer such as a low refractive index layer or an antiglare layer as the outermost layer on the viewer side was taken as 1%, the surface reflectance R when not provided was taken as 4%, and the display device reflection value for the D65 light source without the adhesive sheet, without considering the interface reflection and surface reflection on other layers, was taken 100, and under these conditions, a relative reflection value was calculated according to the formula (2) and evaluated as a display device reflection property.

Formula (2)

Display device reflective property =

$$R + Km \times \int_{380}^{780} (1-R) \times P(\lambda) \times T(\lambda) \times T(\lambda) \times \overline{y}(\lambda) \times 40\%$$

$$Km = 100 \Big/ \int_{380}^{780} P(\lambda) \times \overline{y}(\lambda)$$

Here, R is the surface reflectance of the outermost layer on the observer si de, $T(\lambda)$ is the transmittance of the optical film, $P(\lambda)$ is the D65 light source spectrum, and $\overline{y}(\lambda)$ is the CIE1931 color matching function.

(Color Reproducibility)

Figure 8:
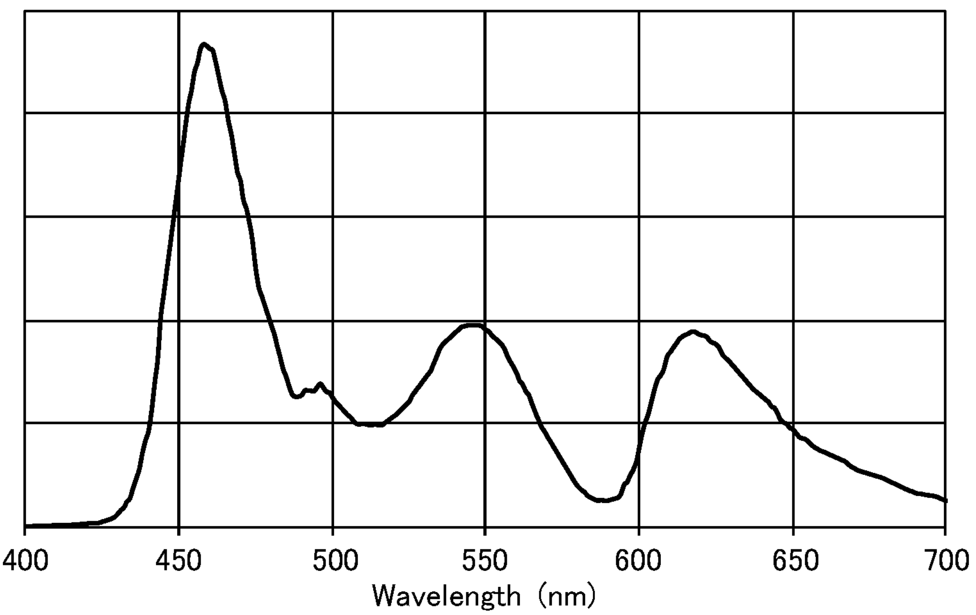
FIG. 8 shows the spectrum of the light source used for evaluating the transmission property.
Figure 9:
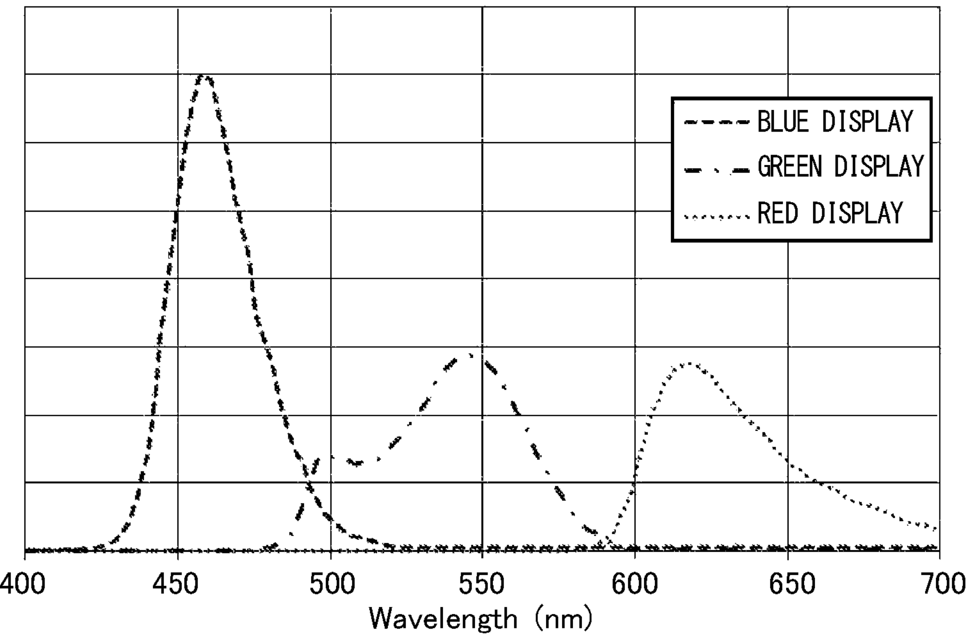
FIG. 9 shows the spectrum of the light source used for evaluating the color reproducibility.

The transmittance of the resulting adhesive sheet was measured using an automatic spectrophotometer (U-4100, manufactured by Hitachi, Ltd.), and red display, green display, and blue display spectra in FIG. 9 output through the white EL light source having the spectrum shown in FIG. 8 and a color filter were measured. The NTSC ratio was calculated from the CIE1931 chromaticity values calculated using the measured transmittance and the red display, green display, and blue display spectra of FIG. 9, and the NTSC ratio was evaluated as an index of color reproducibility.

Table 8 shows the white display transmission property, the display device reflection property, and the color reproducibility as evaluations of properties in the display device.

TABLE 8

| | | Example 6 | Example 11 | Example 13 | Comparative Example 3 |
|---|---|---|---|---|---|
| adhesive sheet | | adhesive sheet 6 | adhesive sheet 11 | adhesive sheet 13 | adhesive sheet 16 |
| white display transmission property | | 60.4 | 60.2 | 58.410 | 92.4 |
| | relative to Comparative Example 3 | 65% | 65% | 63% | 100% |
| display device reflection property | | 14.5 | 14.2 | 15.9 | 34.5 |
| | relative to Comparative Example 3 | 42% | 41% | 46% | 100% |
| color reproducibility | NTSC ratio | 100.0% | 96.7% | 100.0% | 91.7% |

From the results in Table 8, the display device provided with the colored adhesive layer, which is the first adhesive layer, had a significantly lower reflection property. In addition, while it is said that the transmittance is halved with a circularly polarizing plate, the luminance efficiency was excellent as shown by the evaluation value of the white display transmittance property, and the color reproducibility was also improved.

The present invention can be used as an adhesive sheet for optical films used in display devices.

Although the present invention has been described in detail above, the above description is merely an example of the present invention in all respects and does not intend to limit the scope thereof. It is needless to say that various improvements and modifications can be made without departing from the scope of the present invention.

What is claimed is:

1. An adhesive sheet comprising a first adhesive layer including an adhesive and a dye, and an ultraviolet absorbing layer laminated on one surface side of the first adhesive layer, wherein the dye includes a first coloring material having a maximum absorption wavelength in the range of 470 to 530 nm and a half width of the absorption spectrum of 15 to 45 nm, and a second coloring material having a maximum absorption wavelength in the range of 560 to 620 nm and a half width of the absorption spectrum of 15 to 55 nm, and wherein the ultraviolet absorbing layer has an ultraviolet shielding rate of 85% or more according to JIS L 1925, the first coloring material is a pyrromethene cobalt complex, and the first adhesive layer includes a hindered amine light stabilizer having a molecular weight of 2000 or more and a singlet oxygen quencher.

2. The adhesive sheet according to claim 1, wherein the first adhesive layer includes a peroxide decomposer.

3. The adhesive sheet according to claim 1, wherein the singlet oxygen quencher is a transition metal complex of dialkyl phosphate, dialkyldithiocarbamate or benzenedithiol.

4. The adhesive sheet according to claim 1, wherein the first adhesive layer further includes, as the dye, a third coloring material having a maximum absorption wavelength within the range of 650 to 800 nm.

5. The adhesive sheet according to claim 1, wherein the dye included in the first adhesive layer includes one or more compounds selected from the group consisting of compounds having any of a porphyrin structure, a merocyanine structure, a phthalocyanine structure, an azo structure, a cyanine structure, a squarylium structure, a coumarin structure, a polyene structure, a quinone structure, a tetraazaporphyrin structure, a pyrromethene structure and an indigo structure, and metal complexes thereof.

6. The adhesive sheet according to claim 1, wherein the ultraviolet absorbing layer is a second adhesive layer including an adhesive and an ultraviolet absorber.

7. The adhesive sheet according to claim 1, wherein the ultraviolet absorbing layer is a transparent substrate.

8. The adhesive sheet according to claim 1, further comprising an oxygen barrier layer having an oxygen permeability of 10 cc/($m^2$*day*atm) or less on the ultraviolet absorbing layer side of the first adhesive layer.

9. The adhesive sheet according to claim 1, further comprising an antireflection layer including a high refractive index layer and a low refractive index layer, or an antiglare layer, as an optical functional layer for reducing reflection of incident external light, on an upper layer of the ultraviolet absorbing layer.

10. The adhesive sheet according to claim 1, further comprising an antistatic layer or an antifouling layer.

11. A display device comprising the adhesive sheet according to claim 1.

12. A composition for forming adhesive layer comprising an adhesive, a dye, and an additive, wherein the dye includes a first coloring material having a maximum absorption wavelength in the range of 470 to 530 nm and a half width of the absorption spectrum of 15 to 45 nm, and a second coloring material having a maximum absorption wavelength in the range of 560 to 620 nm and a half width of the absorption spectrum of 15 to 55 nm, and wherein the first coloring material is a pyrromethene cobalt complex, and the additive includes a hindered amine light stabilizer having a molecular weight of 2000 or more and a singlet oxygen quencher.

* * * * *